United States Patent

Haga

[19]

[11] Patent Number: 6,041,004
[45] Date of Patent: Mar. 21, 2000

[54] SEMICONDUCTOR DEVICE WITH HIGH SPEED WRITE CAPABILITIES

[75] Inventor: Ryo Haga, Yokohama, Japan

[73] Assignee: Kabushiki Kaisha Toshiba, Kawasaki, Japan

[21] Appl. No.: 08/982,533

[22] Filed: Dec. 2, 1997

[30] Foreign Application Priority Data

Dec. 2, 1996 [JP] Japan .................................. 8-321738

[51] Int. Cl.$^7$ .................................................. G11C 7/02
[52] U.S. Cl. ........................ 365/207; 365/189.01; 365/190
[58] Field of Search ................................ 365/207, 189.01, 365/190, 205, 206

[56] References Cited

U.S. PATENT DOCUMENTS

| | | | |
|---|---|---|---|
| 4,931,994 | 6/1990 | Matsui et al. | 365/189.01 |
| 5,233,558 | 8/1993 | Fujii | 365/189.01 |
| 5,276,649 | 1/1994 | Hoshita et al. | 365/206 |
| 5,659,507 | 8/1997 | Yabe et al. | 365/189.01 |
| 5,740,116 | 4/1998 | Proebsting | 365/205 |
| 5,777,927 | 7/1998 | Takahashi et al. | 365/189.01 |
| 5,831,910 | 11/1998 | Suzuki et al. | 365/207 |
| 5,848,428 | 12/1998 | Collins | 711/127 |

*Primary Examiner*—David Nelms
*Assistant Examiner*—Gene N. Auduong
*Attorney, Agent, or Firm*—Banner & Witcoff Ltd.

[57] ABSTRACT

A semiconductor memory device comprises a memory cell array including a plurality of memory cells arranged in an array and having a plurality of rows and a plurality of columns, a plurality of column select gates, provided in association with the plurality of columns, for selecting at least one column of the plurality of columns of the memory cell array, a column decoder for outputting a column select signal to the plurality of column select gates, a plurality of sense amplifiers arranged between the memory cell array and the plurality of column select gates and provided in association with the plurality of columns, and a sense amplifier control circuit for controlling activation of the sense amplifiers independently such that the sense amplifier control circuit activates at least one selected sense amplifier of the plurality of sense amplifiers, which is associated with the at least one column of the plurality of columns selected by the plurality of column select gates, and maintains the unselected sense amplifiers associated with those columns, which are not selected by the plurality of column select gates, in an inactive state.

18 Claims, 12 Drawing Sheets

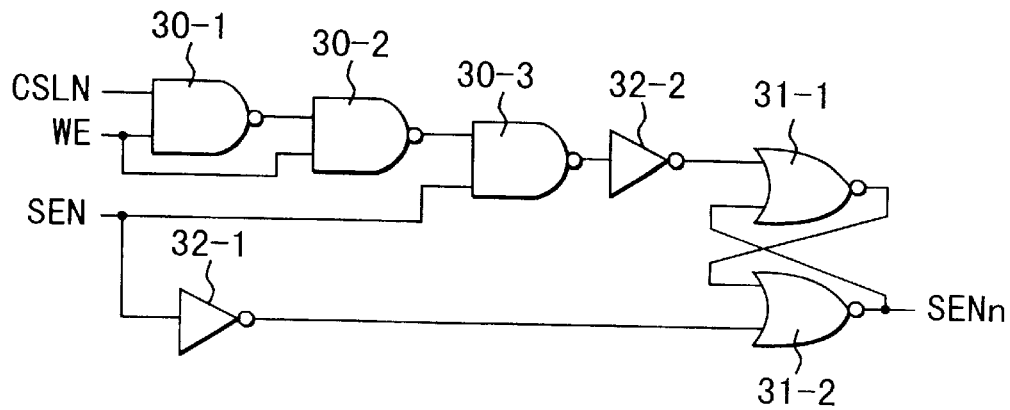
F I G. 10
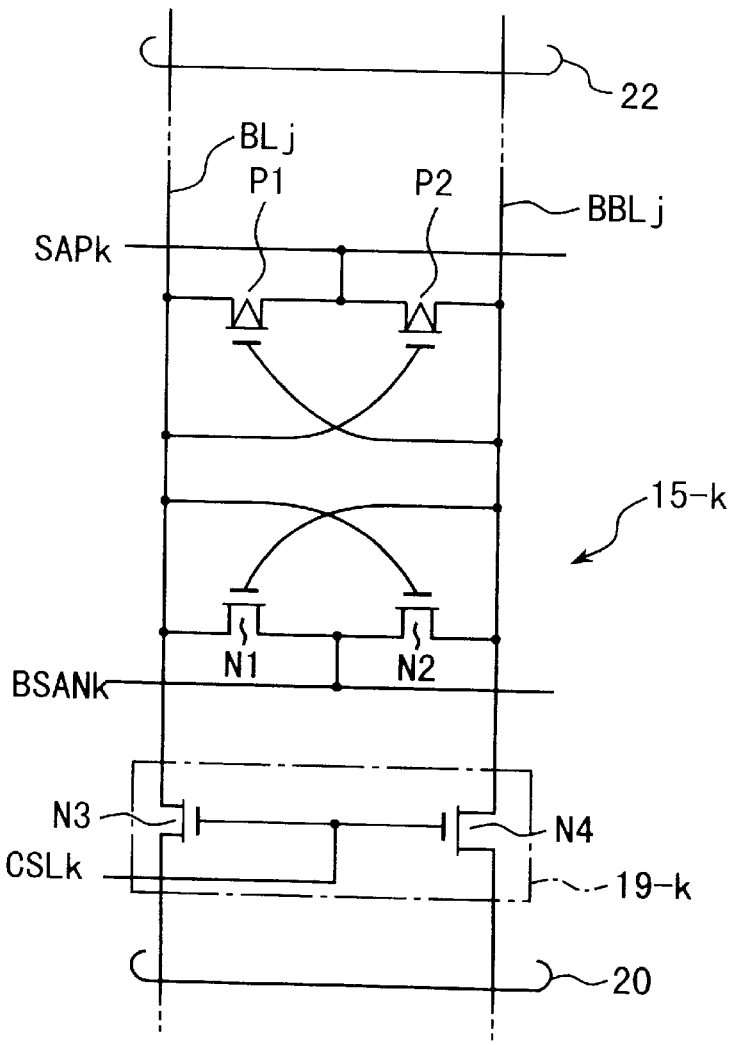
F I G. 11

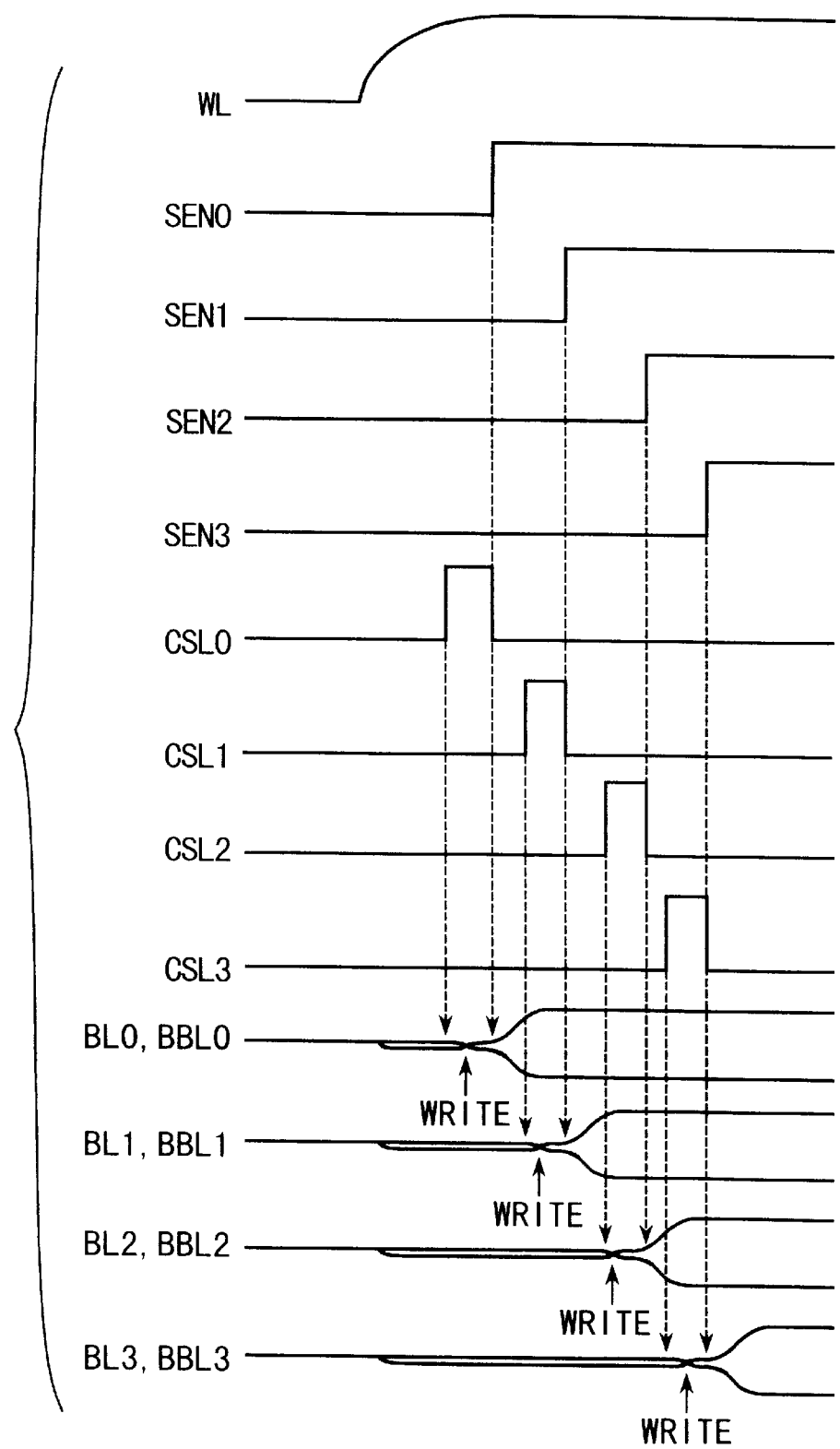
F I G. 12

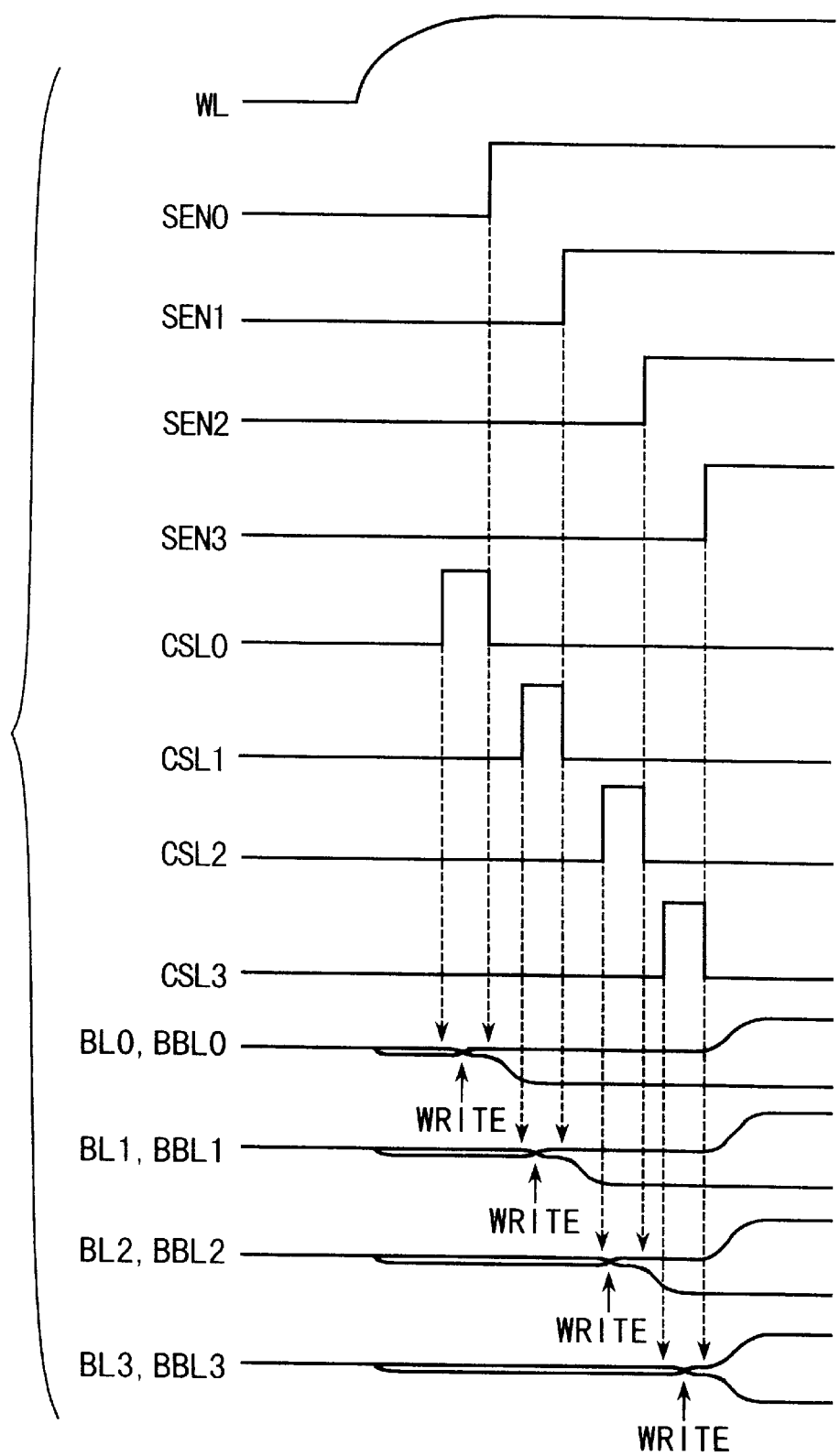
F I G. 13

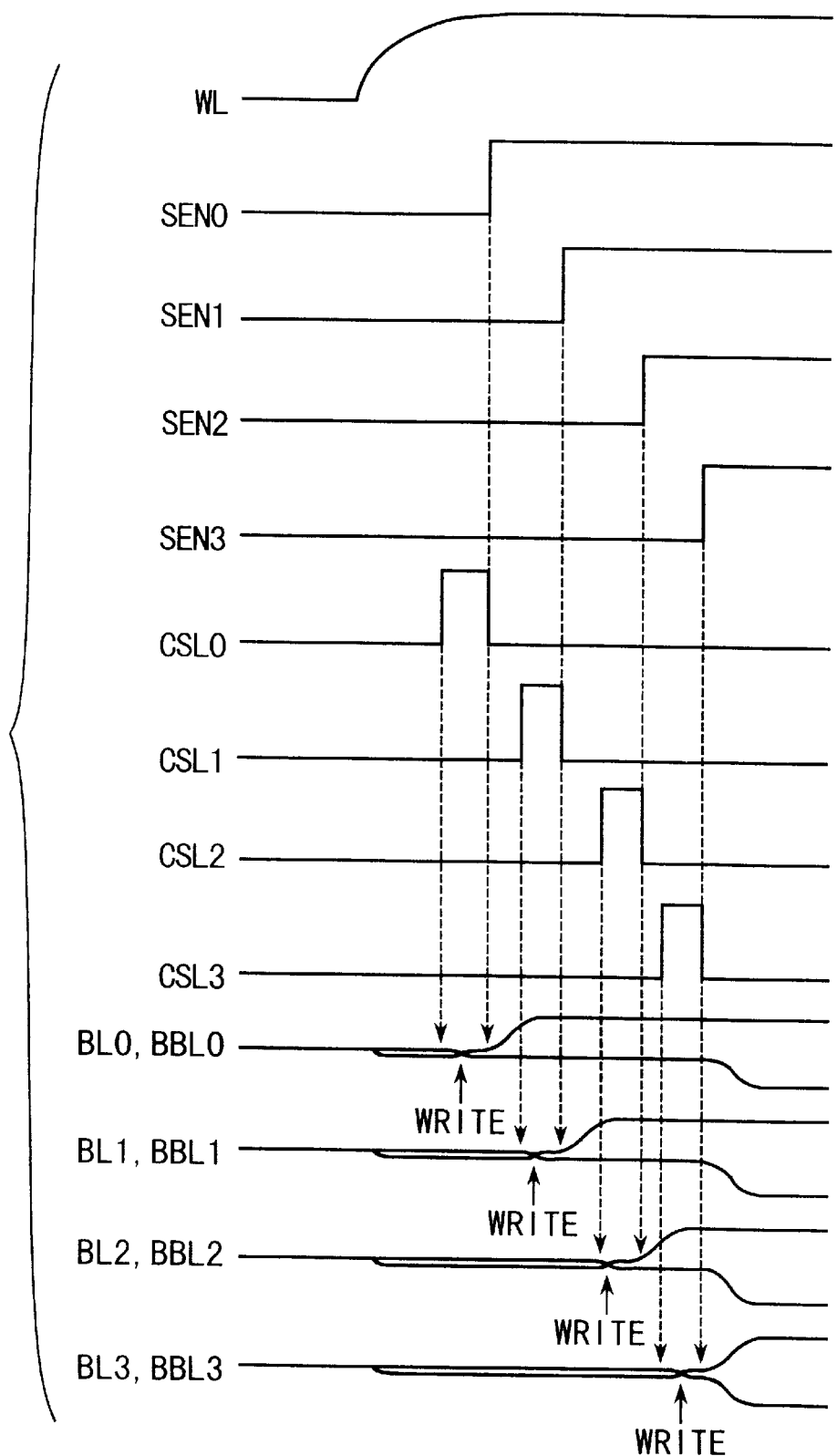
F I G. 14

SEMICONDUCTOR DEVICE WITH HIGH SPEED WRITE CAPABILITIES

BACKGROUND OF THE INVENTION

The present invention relates to a technique of writing data into a semiconductor memory device.

FIG. 1 shows a first example of a conventional DRAM.

A row decoder 11 is provided at a row-directional end portion (i.e., an end portion in a direction in which word lines extend) of a memory cell array 10. Row address signals are input to the row decoder via a row address buffer 12.

A row address strobe signal/RAS is input to a row system control circuit 13. A word line control circuit 14 is controlled by an output signal from the row system control circuit 13 and supplies a high potential to a word line of memory cell array 10, which is selected by the row address signal.

A sense amplifier 15 is provided at a column-directional end portion (i.e., an end portion in a direction in which bitline pairs extend) of memory cell array 10. The sense amplifier 15 is activated and deactivated by a sense amplifier control circuit 16.

The amplifier control circuit 16 is operated on the basis of an output signal SEN from the word line control circuit 14. Specifically, when a row of the memory cell array 10 has been selected and a high potential has been applied to the word line, output signals SAP and BSAN for activating the sense amplifier 15 are output.

A column address signal is input to a column decoder 18 via a column address buffer 17. Based on the column address signal, the column decoder 18 opens and closes a column select gate 19.

A data bus (hereinafter referred to as "DQ bus") 20 serves as a data path between the column select gate 19 and a data input/output (I/O) buffer 21.

FIG. 2 shows in detail the layout of the memory cell array 10, sense amplifier 15 and column select gate 19 shown in FIG. 1.

The memory cell array 10 comprises an n-number of blocks BK1, BK2, . . . , BKn. The number of bits permitting simultaneous read/write is an n (bits) (1-bit×n structure). The blocks BK1, BK2, . . . , BKn have the same structure.

Word lines 24 extending from the row decoder 11 are arranged on the blocks BK1, BK2, . . . , BKn and connected to a plurality of memory cells 23 belonging to the same row of the memory cell array 10.

Each block has four columns C0 to C3. Each column comprises a bitline pair. A plurality of memory cells 23 belonging to the same column are connected to the bitline pair 22.

One end of the bitline pair 22 of each of columns C0 to C3 is connected to one of data line pairs (hereinafter referred to as "DQ line pairs") 20-1 to 20-n via one of sense amplifiers 15-0 to 15-3 and one of column select gates 19-0 to 19-3.

The sense amplifiers 15-0 to 15-3 are activated and deactivated by control signals SAP and BSAN.

The column select gates 19-0 to 19-3 are opened and closed by column select signals CSL0 to CSL3 output from the column decoder. In each block, one column is selected. Thus, one of the four column select gates 19-0 to 19-3 is turned on. The column select gates 19-0 to 19-3 are constituted by, for example, N-channel MOS transistors.

An n-number of DQ line pairs 20-1 to 20-n extend from the n-number of blocks BK1, BK2, . . . , BKn. The DQ bus 20 comprises the n-number of DQ line pairs 20-1 to 20-n.

In the DRAM having the above structure, when data is to be read out, a row address signal is supplied to the row decoder 11. The row decoder 11 applies a high potential to a word line (row) designated by the row address signal, thereby activating the word line.

In each of blocks BK1, BK2, . . . , BKn, data of the memory cells connected to activated word lines are transferred to the sense amplifiers 15-0 to 15-3 corresponding to the columns C0 to C3, and are latched.

Then, the column select gate, 19-0 to 19-3, of the column, C0 to C3, designated by the column address signal is turned on, and the data of the sense amplifier, 15-0 to 15-3, connected to this column, C0 to C3, is led to the I/O buffer 21 via the DQ line pair, 20-1 to 20-n.

As is shown in FIG. 3, when data is to be written, the row address signal is at first supplied to the row decoder. The row decoder applies a high potential to the word line (row) Wli designated by the row address signal, thereby activating the word line WLi.

In each of the blocks BK1, BK2, . . . , BKn, data of the memory cells connected to the activated word line WLi is led to the sense amplifiers 15-0 to 15-3 of the columns C0 to C3. When the control signal SEN has been set at a high potential, the control signal SAP at a high potential and the control signal BSAN at a low potential, the sense amplifier is activated and the potential of bitline pair BLj, BBLj is amplified.

Thereafter, one of the column select gate of the columns C0 to C3, designated by the column address signal is turned on, and write data is led from the I/O buffer to the designated one of columns C0 to C3, via the DQ line pair.

At this time, the following problem will occur if the write data differs from the data in the memory cells 23 belonging to the designated row and column.

In the designated one of columns C0 to C3, data (e.g. "0") of memory cell 23 is latched and then write data (e.g. "1") is latched. Accordingly, the data of the sense amplifier of the designated one of columns C0 to C3 must be inverted by the write data. The time (write data) needed to invert the data is very long, and this prevents high-speed data write.

FIG. 4 shows an example in which the data write time in the DRAM shown in FIG. 1 is decreased by specially setting the timing for data write.

At first the row address signal is supplied to the row decoder. The row decoder applies a high potential to the word line (row) WLi designated by the row address signal, thereby activating the word line WLi. In each block, BK1, BK2, . . . , BKn, the data of the memory cells connected to the activated word line WLi is led to the sense amplifiers corresponding to the columns C0 to C3.

When a column select line CSLj of one of the columns C0 to C3, designated by the column address signal has been set at a high potential, the column select gate of the associated column is turned on, and the write data is delivered to the sense amplifier of one of the columns C0 to C3.

At this time, since the sense amplifier has not been activated, the potential of bitline pair BLj, BBLj is inverted in a short time, even if the write data differs from the data in the memory cells.

When the control signal SEN has been set at a high potential, the control signal SAP at a high potential and the control signal BSAN at a low potential, the sense amplifier is activated and the potential of bitline pair BLj, BBLj is amplified. Thus, the data write in the memory cells is completed.

However, in the above-described timing, the word line WLi is designated, the sense amplifiers of all columns are activated.

Accordingly, in the first write for the first column after the word line WLi has been designated, the write time is reduced. However, in the second write for the second column after the first write, the write time may increase.

Specifically, in the second write, since the sense amplifiers of all columns were already activated, if the write data differs from the data of the memory cells, a long time is needed to invert the potential of the bitline pair BLj, BBLi.

FIG. 5 shows a second example of the conventional DRAM.

In the DRAM of the second example, write data to be written in all columns is latched in a data latch circuit, and the write data is led to the sense amplifier. Then, the sense amplifiers of all columns are activated and at the same time the write data is written in all columns.

A row decoder 11 is provided at a row-directional end portion of a memory cell array 10. A row address signal is input to the row decoder 11 via a row address buffer 12.

A row address strobe signal/RAS is input to a row system control circuit 13. A word line control circuit 14 is controlled by an output signal from the row system control circuit 13 and applies a high potential to a word line of the memory cell array 10, which has been selected by the row address signal.

A sense amplifier 15 is provided at a column-directional end portion of the memory cell array 10. The sense amplifier 15 is activated and deactivated by a sense amplifier control circuit 16.

The sense amplifier control circuit 16 is operated on the basis of an output signal SEN from the word line control circuit 14. Specifically, when a row of the memory cell array 10 is selected and a high potential is applied to the word line, output signals SAP and BSAN for activating the sense amplifier 15 are output.

A column address signal is input to a column decoder 18 via a column address buffer 17. Based on the column address signal, the column decoder 18 opens and closes a column select gate 19.

A DQ bus 20 serves as a data path between the column select gate 19 and a data input/output (I/O) buffer 21.

A data latch circuit 25 and a transfer gate 26 are connected between the sense amplifier 15 and column select gate 19. The data latch circuit 25 can latch input/output data of all columns. The transfer gate 26 serves as a data transfer path between the sense amplifier 15 and data latch circuit 25. The data transfer is enabled/disabled by the opening/closing of the transfer gate 26.

A transfer gate control signal is input to the transfer gate control circuit. Based on the transfer gate control signal, the transfer gate control circuit 27 controls the transfer of data by the transfer gate 26.

FIG. 6 is a timing chart illustrating the operational timing at a data write operation in the DRAM shown in FIG. 5.

At first, a row address signal is supplied to the row decoder. The row decoder then applies a high potential to the word line (row) WLi designated by the row address signal, thereby activating the word line WLi. In each of the blocks BK1, BK2, . . . , BKn, the data of memory cells connected to the activated word line WLi is led to the sense amplifiers of the columns C0 to C3.

When the column selection line CSLj of one of the columns C0 to C3, designated by the column address signal is set at a high potential, the column select gate of the column is turned on and the write data is latched in the data latch circuit. Similarly, the write data is latched in the data latch circuit for all columns C0 to C3.

Thereafter, the control signal TG is set at a high potential to turn on the transfer gate. The data of columns C0 to C3, which is latched in the data latch circuit, is simultaneously led to the sense amplifiers corresponding to the columns C0 to C3 at a time.

In this case, since the sense amplifiers corresponding to the columns C0 to C3 are not activated, even if the write data differs from the data of the memory cells, the potential of bitline pair BLj, BBLj is inverted in a short time.

When the control signal SEN is set at a high potential, the control signal SAP becomes at a high potential and the control signal BSAN becomes at a low potential, the sense amplifiers of the columns C0 to C3 are activated and the potential of the bitline pair BLi, BBLj is amplified. The data write in the memory cells is thus completed.

According to the DRAM having the above structure, the data to be written in all columns is latched in the data latch circuit, and the latched data is led to the sense amplifiers. Then the sense amplifiers of all columns are activated and the data is written in all columns. Accordingly, in the DRAM of this example, high-speed data write can be achieved.

However, in order to achieve the high-speed write in this DRAM, it is necessary to provide new structural elements such as the data latch circuit, transfer gate and transfer gate control circuit. This results in a drawback, in which the chip size of the DRAM increases.

As has been described above, according to the conventional semiconductor memory device, when data is to be written in memory cells of the same row and different columns, data cannot be written at high speed in all memory cells due to the timing of activation of the sense amplifiers.

This drawback may be overcome by adding a structural element such as a data latch circuit. However, the structure such as the data latch circuit requires a large area within the memory chip. This results in a drawback in which the chip size of the DRAM increases.

BRIEF SUMMARY OF THE INVENTION

The object of the present invention is to provide a semiconductor memory device capable of writing data in all memory cells at high speed, without increasing the size of the memory chip.

In order to achieve the object, the present invention provides a semiconductor memory device comprising: a memory cell array including a plurality of memory cells arranged in an array and having a plurality of rows and a plurality of columns; a plurality of column select gates, provided in association with the plurality of columns, for selecting at least one column of the plurality of columns of the memory cell array; a column decoder for outputting a column select signal to the plurality of column select gates; a plurality of sense amplifiers arranged between the memory cell array and the plurality of column select gates and provided in association with the plurality of columns; and a sense amplifier control circuit for controlling activation of the sense amplifiers independently such that the sense amplifier control circuit activates at least one selected sense amplifier of the plurality of sense amplifiers, which is associated with the at least one column of the plurality of columns selected by the plurality of column select gates, and maintains the unselected sense amplifiers associated with those columns, which are not selected by the plurality of column select gates, in an inactive state.

The embodiments of the semiconductor memory device of this invention are as follows:

(1) The sense amplifier control circuit activates the selected sense amplifier at the same time as or after the selection of the column to be selected.

(2) A row decoder for selecting at least one of the plurality of rows of the memory cell array is further provided and the sense amplifier control circuit activates the selected sense amplifier while the row of the memory cell array is selected by the row decoder.

(3) Each of the plurality of sense amplifiers includes a first portion for amplifying a potential of a low-potential-side bitline of a bitline pair of the memory cell array, and a second portion for amplifying a potential of a high-potential-side bitline of the bitline pair of the memory cell array, and the sense amplifier control circuit simultaneously activates the first portion and the second portion of the selected sense amplifier.

(4) Each of the plurality of sense amplifiers includes a first portion for amplifying a potential of a low-potential-side bitline of a bitline pair of the memory cell array, and a second portion for amplifying a potential of a high-potential-side bitline of the bitline pair of the memory cell array, and the sense amplifier control circuit activates the first portions of the plurality of sense amplifiers at different time points and activates the second portions of the plurality of sense amplifiers at the same time as or after the completion of activation of the first portions of all the sense amplifiers.

(5) Each of the sense amplifiers includes a first portion for amplifying a potential of a low-potential-side bitline of a bitline pair of the memory cell array, and a second portion for amplifying a potential of a high-potential-side bitline of the bitline pair of the memory cell array, and the sense amplifier control circuit activates the second portions of the plurality of sense amplifiers at different time points and activates the first portions of the plurality of sense amplifiers at the same time as or after the completion of activation of the second portions of all the plurality of sense amplifiers.

(6) The memory cell array comprises at least two blocks, and the selected sense amplifier is activated for each of the at least two blocks.

(7) The sense amplifier control circuit controls activation of the sense amplifiers independently only when data is to be written.

This invention also provides a data write method comprising: a first step of selecting a row of a memory cell array; a second step of selecting a column of the memory cell array by means of a column select signal, and activating a sense amplifier of the selected column selected on the basis of the column select signal independently from sense amplifiers of non-selected columns, at the same time as or after write data is delivered to the selected column; and a third step of performing the second step again, and selecting all columns of the memory cell array and writing data in the memory cells belonging to the same row of the memory cell array.

The embodiments of the data write method of this invention are as follows:

(1) In the second step the sense amplifier of the selected column simultaneously amplifies a potential of a low-potential-side bitline and a high-potential-side bitline of a bitline pair of the selected column.

(2) In the second step the sense amplifier of the selected column amplifies a potential of a low-potential-side bitline of a bitline pair of the selected column, and a high-potential-side bit line of the bitline pair of the selected column is amplified at the same time as or after a potential of a low-potential-side bitline of a bitline pair of a finally selected column is amplified. The amplification is performed at the same time for all columns.

(3) In the second step the sense amplifier of the selected column amplifies a potential of a high-potential-side bitline of a bitline pair of the selected column, and a low-potential-side bit line of the bitline pair of the selected column is amplified at the same time as or after a potential of a high-potential-side bitline of a bitline pair of a finally selected column is amplified. The amplification is performed at the same time for all columns.

According to the semiconductor memory device and data write method of the present invention, the following advantages can be obtained.

In the present invention, as described above, the sense amplifiers are activates on a column-by-column basis, in accordance with an output signal SEN from the word line control circuit and output signals (column select signals) from the column decoder CSL0, . . . , CSLn-1.

Specifically, after write data are transferred to the sense amplifier of the selected column, the sense amplifier of the selected column is activated and the potential of the bitline pair is amplified. Thus, even if the data in the memory cell differs from the write data, the time for inverting the potential of the bitline pair may be short. Furthermore, the sense amplifier to be activated is limited to the one which is associated with the selected column, the power consumption is reduced.

Therefore, according to the present invention, in order to achieve high-speed data write, there is no need to provide a large-sized circuit such as a data latch circuit. Accordingly, the chip size can be reduced and the high-speed data write can be achieved. Moreover, the power consumption can be reduced.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 10 shows an example of the structure of a sense amplifier controller shown in FIG. 9;

FIG. 11 shows an example of the structure of a sense amplifier and a column select gate shown in FIG. 7;

FIG. 12 shows a first timing of a data write operation in the DRAM shown in FIG. 7;

FIG. 13 shows a second timing of the data write operation in the DRAM shown in FIG. 7; and FIG. 14 shows a third timing of the data write operation in the DRAM shown in FIG. 7.

DETAILED DESCRIPTION OF THE INVENTION

A semiconductor memory device and a write method thereof according to the present invention will be described in detail with reference to the accompanying drawings.

Figure 1:
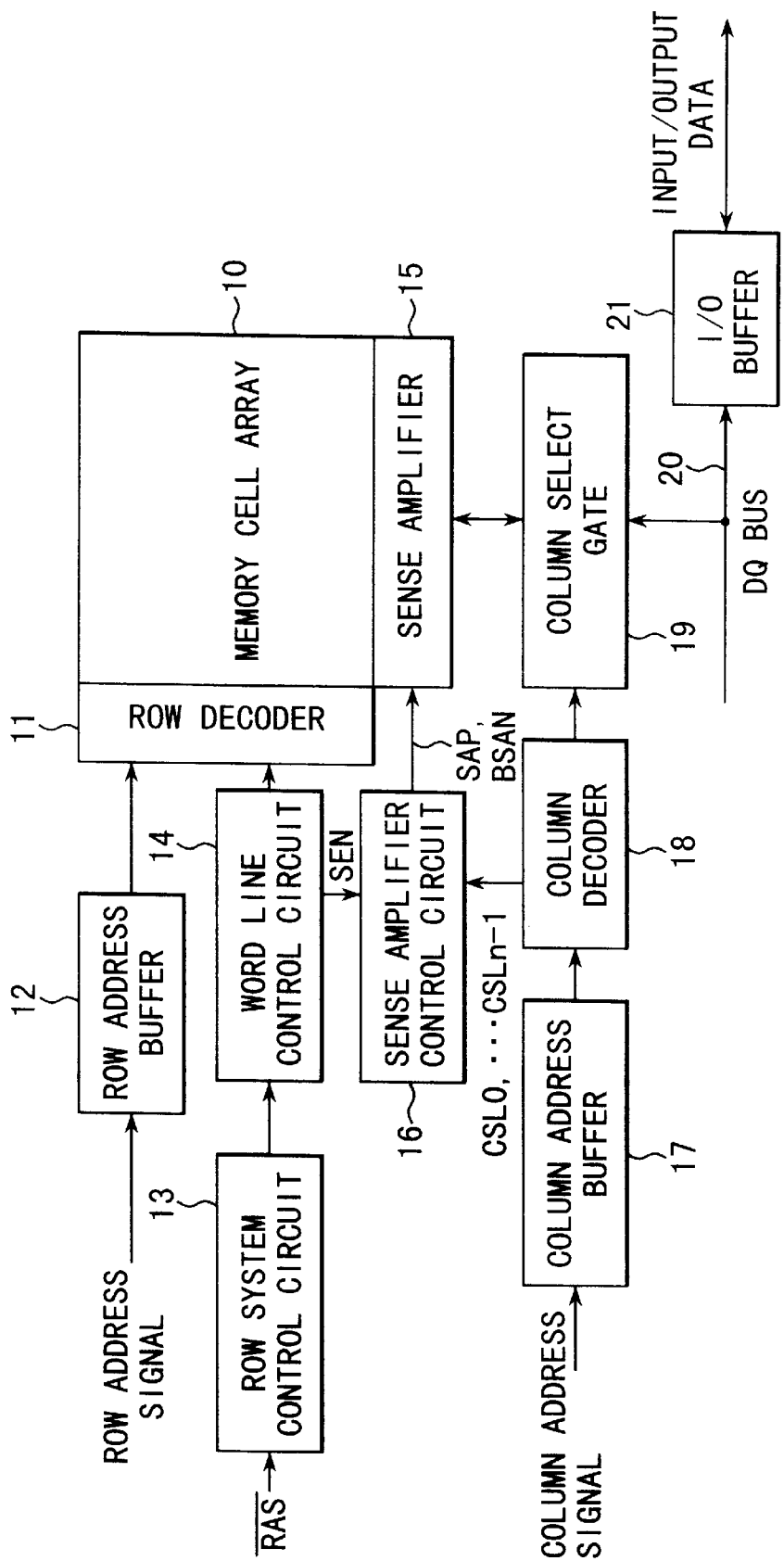
FIG. 1 is a block diagram showing a first example of a conventional DRAM.
Figure 2:
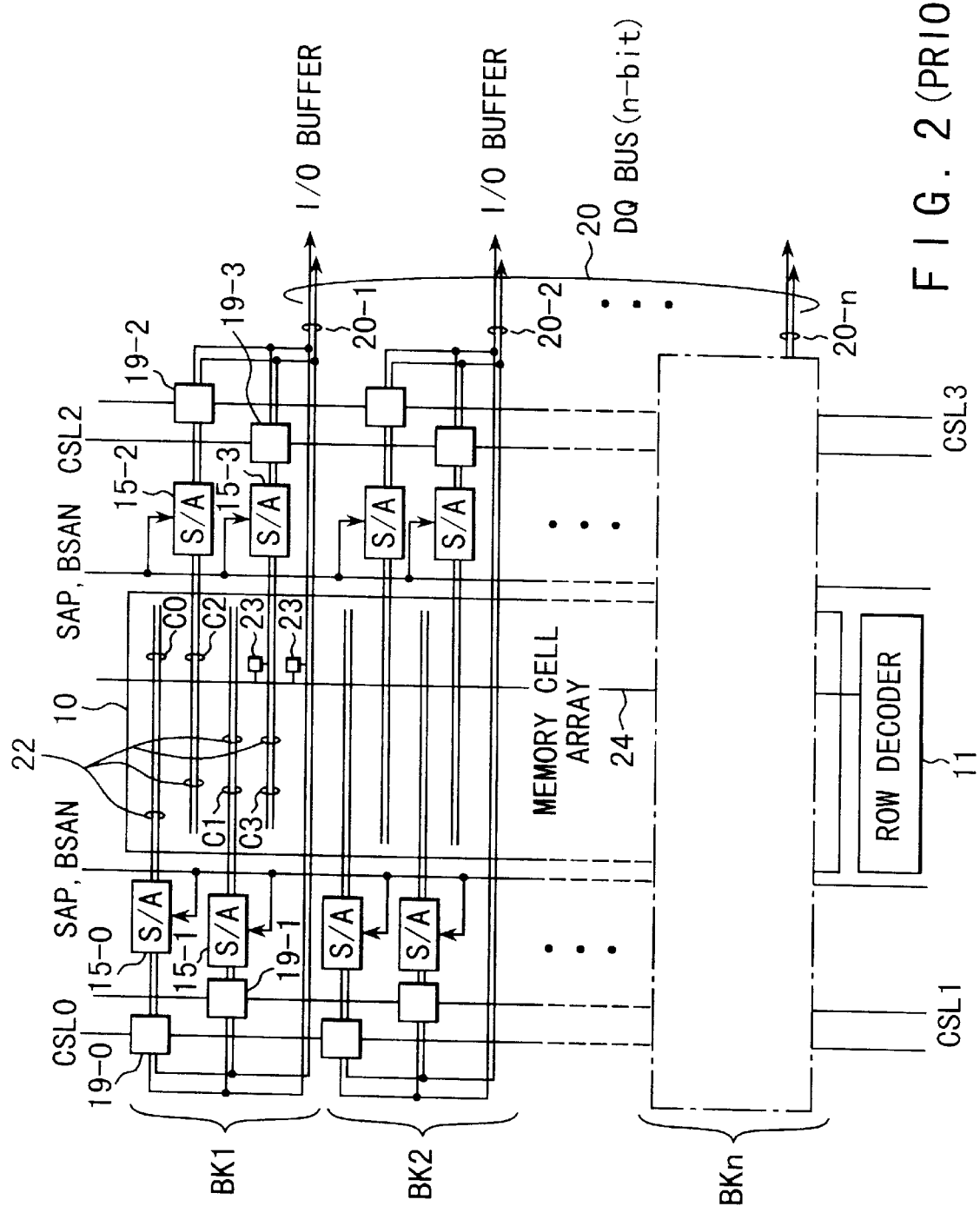
FIG. 2 shows an example of the layout of a memory cell array, a sense amplifier and a column select gate shown in FIG. 1.
Figure 3:
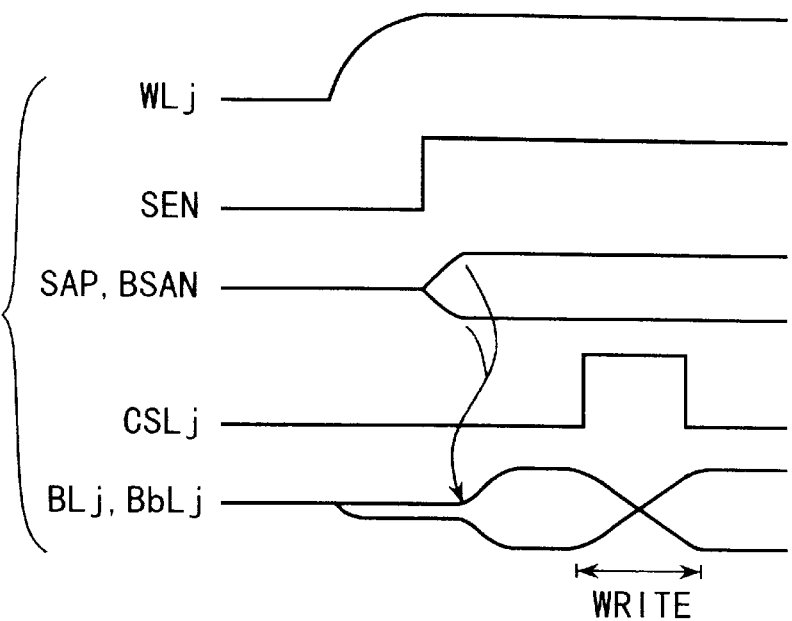
FIG. 3 shows an example of a data write operation timing in the DRAM shown in FIG. 1.
Figure 4:
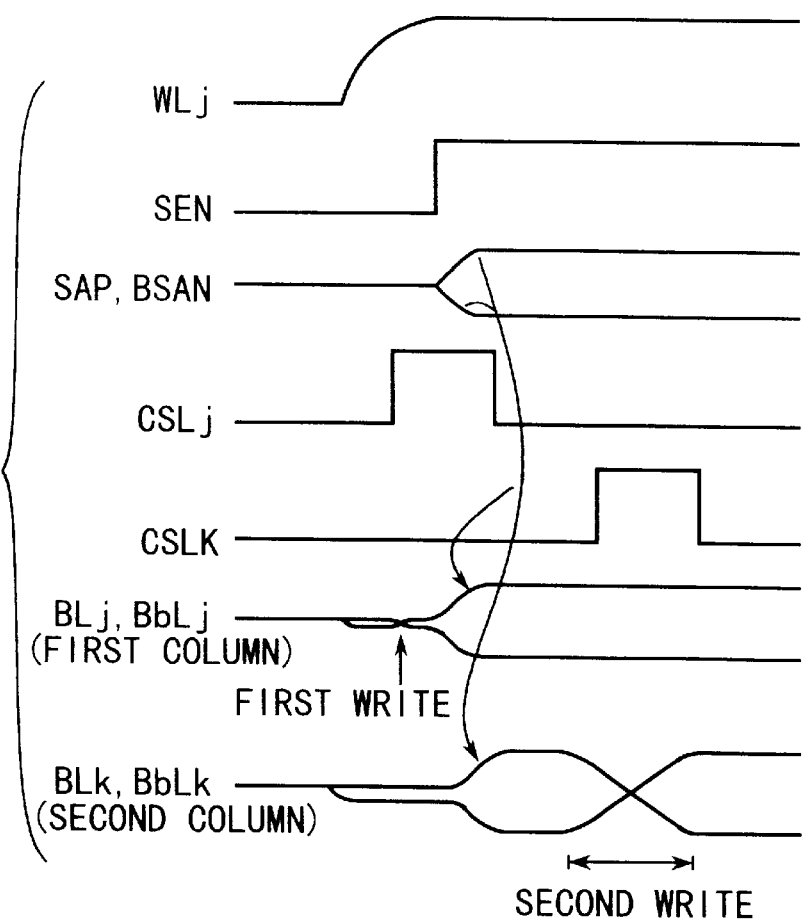
FIG. 4 shows another example of the data write operation timing in the DRAM shown in FIG. 1.
Figure 5:
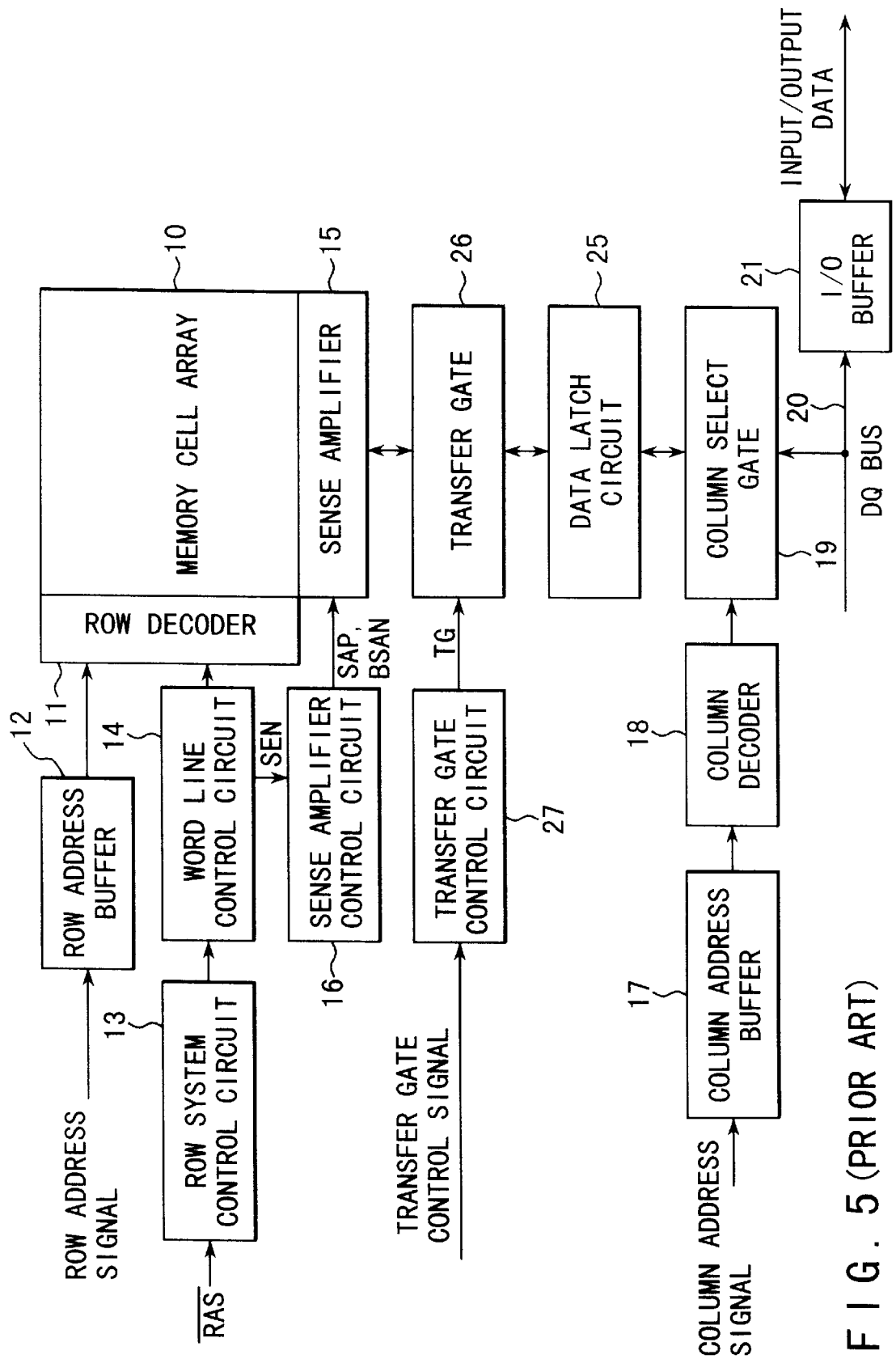
FIG. 5 is a block diagram showing a second example of the conventional DRAM.
Figure 6:
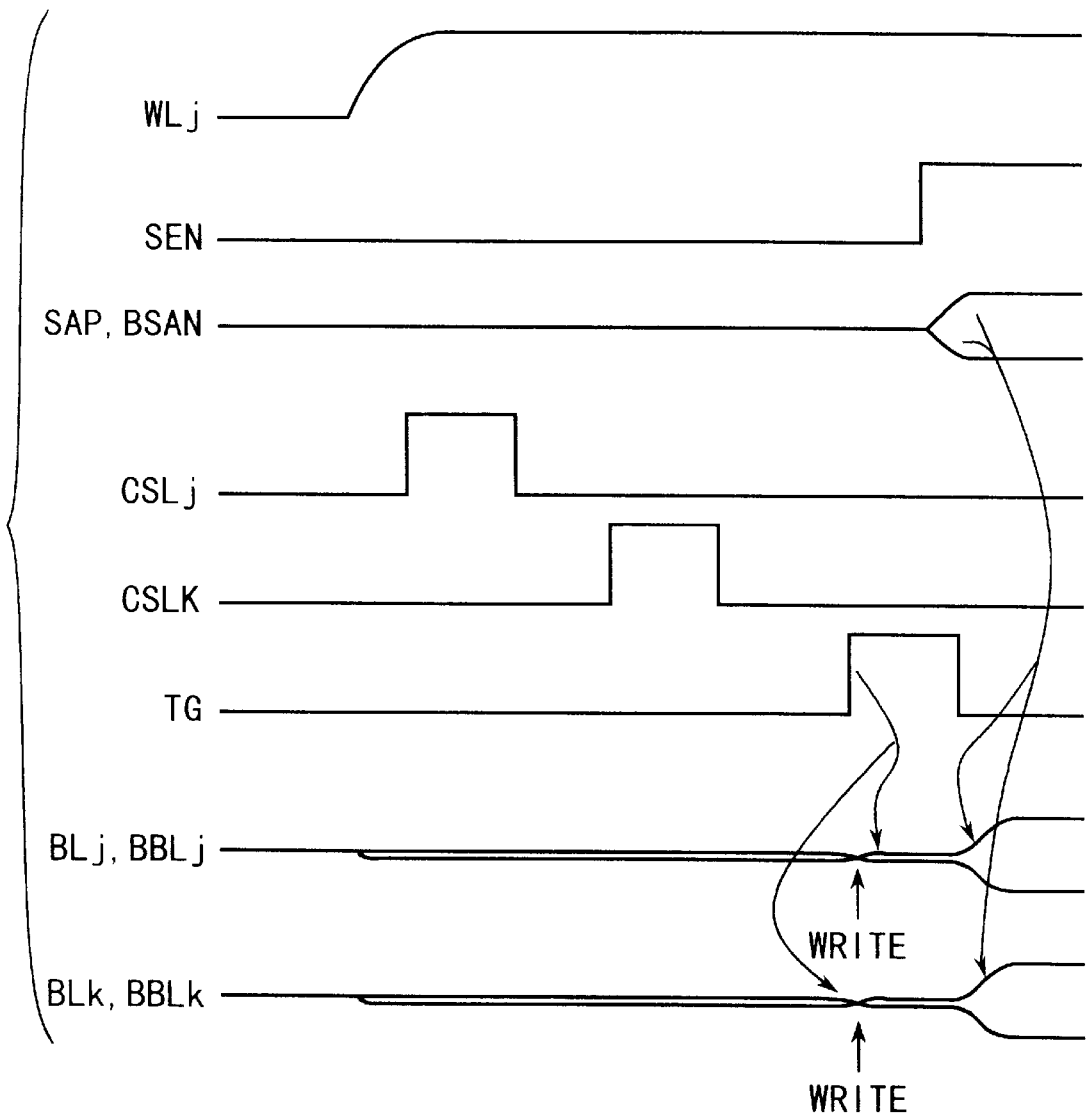
FIG. 6 shows an example of a data write operation timing in the DRAM shown in FIG. 5.
Figure 7:
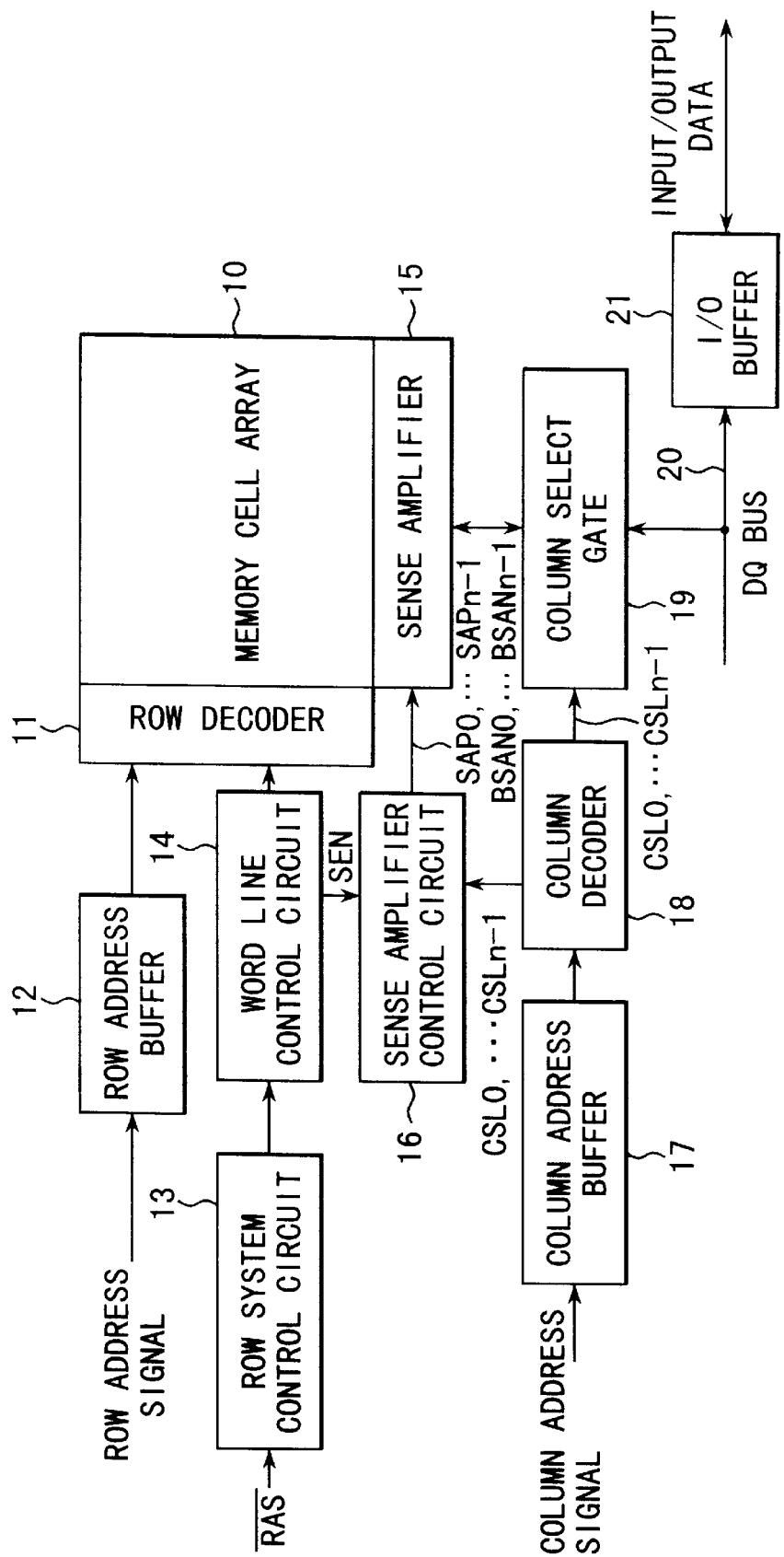
FIG. 7 is a block diagram showing a DRAM according to an embodiment of the present invention.

FIG. 7 shows a DRAM according to a first embodiment of the present invention.

A row decoder 11 is provided at a row-directional end portion (i.e., an end portion in a direction in which word lines extend) of a memory cell array 10. A row address signal is input to the row decoder 11 via a row address buffer 12.

A row address strobe signal/RAS is input to a row system control circuit 13. A word line control circuit 14 is controlled by an output signal from the row system control circuit 13 and applies a high potential to a word line of memory cell array 10, which has been selected by the row address signal. If the high potential is applied to the word line of memory cell array 10, an output signal SEN from the word line control circuit is set at a high potential (i.e., at an active level).

A sense amplifier 15 is provided at a column-directional end portion (i.e., an end portion in a direction in which bitline pairs extend) of memory cell array 10. The sense amplifier 15 is activated and deactivated by output signals SAP0, BSAN0, . . . , SAPn-1, BSANn-1 from a sense amplifier control circuit 16.

The output signals SAP0, . . . , SAPn-1 are signals for amplifying the potential of one of bitlines which has a higher potential value. The output signals BSAN0, . . . , BSANn-1 are signals for amplifying the potential of one of the bitlines which has a lower potential value.

The output signals SAP0 and BSAN0 control the activation/deactivation of the sense amplifier of the column C0 of memory cell array 10. Similarly, the output signals SAPn-1 and BSANn-1 control the activation/deactivation of the sense amplifier of the column Cn-1 of memory cell array 10.

A column address signal is input to a column decoder 18 via a column address buffer 17. Based on the column address signal, the column decoder 18 outputs column select signals CSL0, . . . , CSLn-1. The column select signals CSL0, . . . , CSLn-1 are supplied to a column select gate 19 to control the opening/ closing of the column select gate 19. The column select signals CSL0, . . . , CSLn-1 are also supplied to the sense amplifier control circuit 16.

A data bus (hereinafter referred to as "DQ bus") 20 serves as a data path between the column select gate 19 and a data input/output (I/O) buffer 21.

The semiconductor memory device of the present invention is characterized in that the sense amplifier control circuit 16 controls the activation/deactivation of the respective sense amplifiers 15 individually on the basis of the output signal SEN from the word line control circuit 14 and the output signals CSL0, . . . , CSLn-1 from the column decoder 18.

Specifically, when the output signal SEN is at high potential, the sense amplifier control circuit 16 activates only the sense amplifier of the column selected by the column select signals CSL0, . . . , CSLn-1 and maintains the sense amplifiers of the unselected columns in the inactive state.

In the present invention, the activation/deactivation of sense amplifiers 15 is controlled on a column-by-column basis, and write data is delivered to the sense amplifier of a specified column. After the potential of the bitline pair of the specified column is determined, the sense amplifier of this specified column is activated. With this timing, high-speed data write for all columns is executed.

Figure 8:
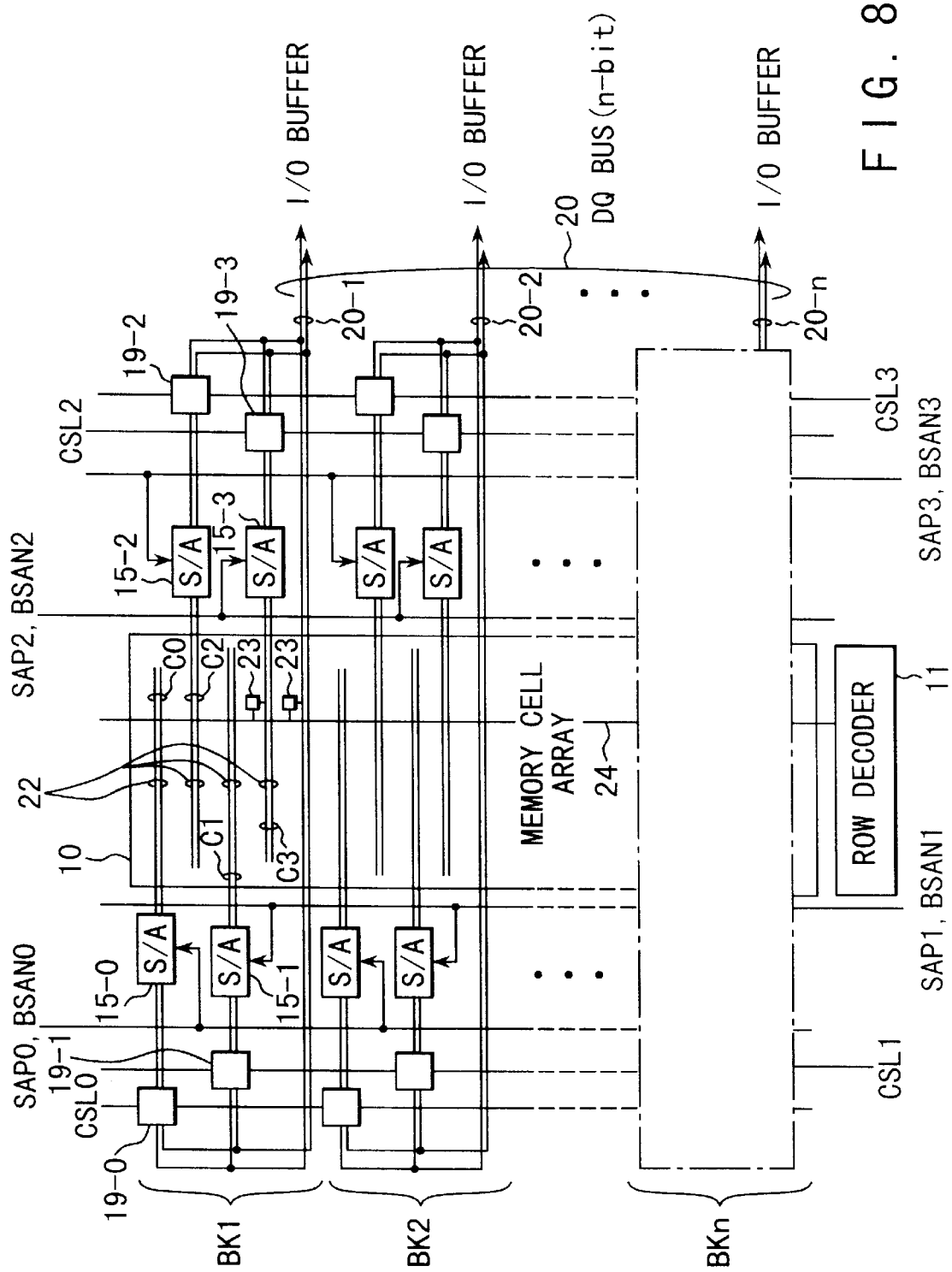
FIG. 8 shows an example of the layout of a memory cell array, a sense amplifier and a column select gate shown in FIG. 7.

FIG. 8 shows the detail layout of the memory cell array 10, the sense amplifier 15 and the column select gate 19 shown in FIG. 7.

The memory cell array 10 comprises an n-number of blocks BK1 BK2, . . . , BKn. The number of bits permitting simultaneous read/write is an n (bits) (1-bit×n structure). The blocks BK1, BK2, BKn have the same structure.

Word lines 24 extending from the row decoder 11 are arranged on the blocks BK1, BK2, . . . , BKn and connected to a plurality of memory cells 23 belonging to the same row of the memory cell array 10.

Each block has four columns C0 to C3. The number of columns is not limited to four, and may be two or more.

Each column comprises a bitline pair 22. A plurality of memory cells 23 belonging to the same column of memory cell array 10 are connected to the bitline pair 22.

One end of the bitline pair 22 of each of columns C0 to C3 is connected to one of the data line pairs (hereinafter referred to as "DQ line pairs") 20-1 to 20-n via one of the sense amplifiers 15-0 to 15-3 and one of the column select gates 19-0 to 19-3.

The sense amplifiers 15-0 to 15-3 of the respective columns are activated and deactivated by control signals SAP0, BSAN0, . . . , SAPn-1, BSANn-1.

For example, the sense amplifier 15-0 of column C0 is controlled by control signals SAP0 and BSAN0. Similarly, the sense amplifier 15-1 of column C1 is controlled by control signals SAP1 and BSAN1.

The column select gates 19-0 to 19-3 are opened and closed by column select signals CSL0 to CSL3 output from the column decoder. In each block, one column is selected. Thus, one of the four column select gates 19-0 to 19-3 is turned on. The column select gates 19-0 to 19-3 are constituted by, for example, N-channel MOS transistors.

An n-number of DQ line pairs 20-1 to 20-n extend from the n-number of blocks BK1, BK2, . . . , BKn. The DQ bus 20 comprises the n-number of DQ line pairs 20-1 to 20-n.

Figure 9:
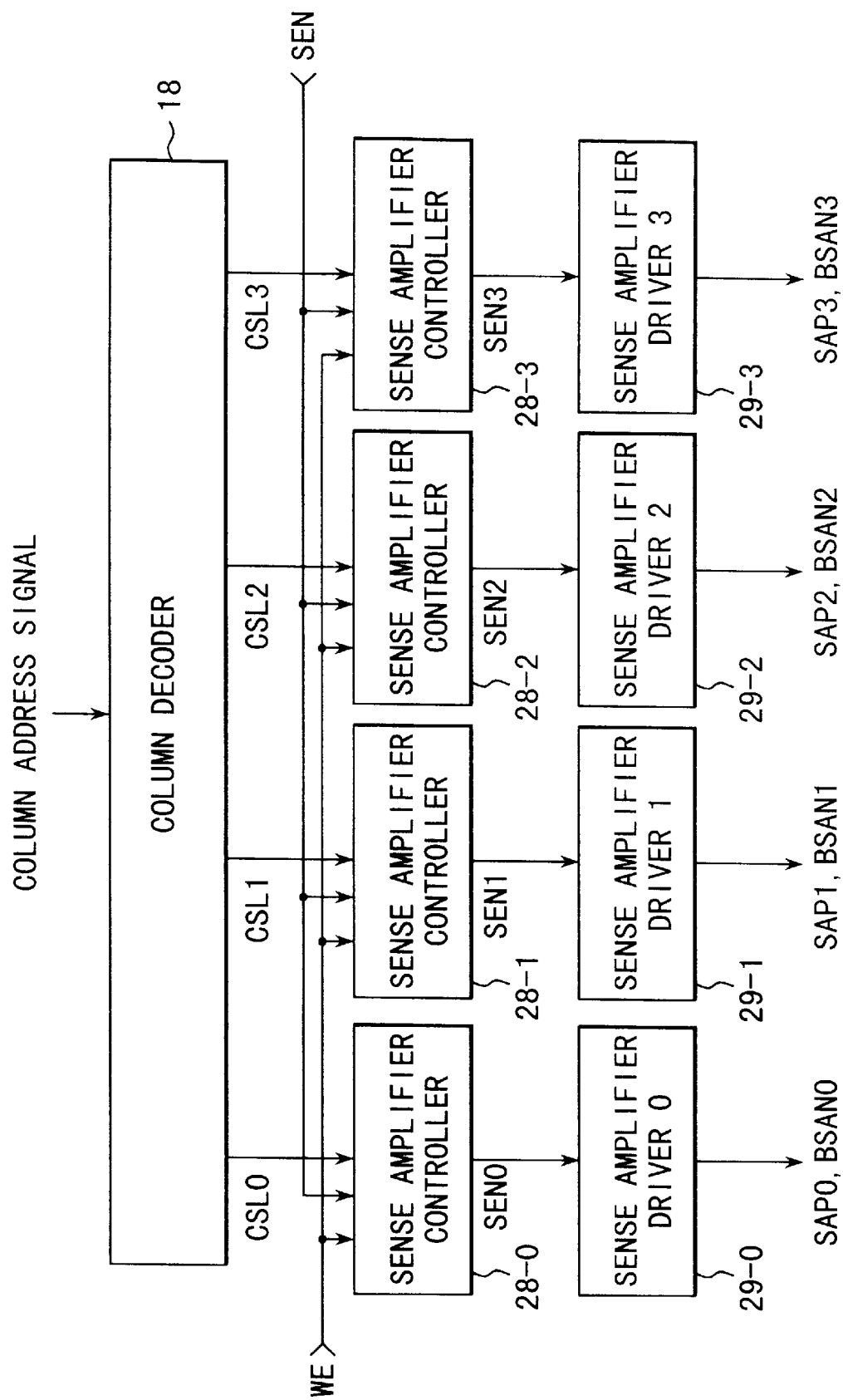
FIG. 9 shows an example of the structure of a sense amplifier control circuit shown in FIG. 7.

FIG. 9 shows an example of the structure of the sense amplifier control circuit 16 shown in FIG. 7.

The sense amplifier control circuit of this embodiment comprises sense amplifier controllers 28-0 to 28-3 and sense amplifier drivers 29-0 to 29-3.

The number of sense amplifier controllers 28-0 to 28-3 and the number of sense amplifier drivers 29-0 to 29-3 are, respectively, equal to the number of columns of the memory cell array (i.e., equal to the number of sense amplifiers in this embodiment).

The column select signal SCLk (k=0 to 3) is input to the sense amplifier controller 28-k. The column select signal SCLk functions to select the column Ck of the memory cell array. For example, the column select signal CSL0 is input to the sense amplifier controller 28-0, and the column select signal CSL1 to the sense amplifier controller 28-1.

The output signal SEN from the word line control circuit 14 is input to all sense amplifier controllers 28-0 to 28-3.

The sense amplifier controller 28-k outputs an output signal SENk of high potential (active level), for example, when the output signal SEN is at high potential (active) and the column select signal CSLk is at high potential (active).

The output signal SENk is input to the sense amplifier driver 29-k. The sense amplifier driver 29-k is activated when the output signal SENk is at high potential, and outputs a control signal SAPk (e.g. at high potential) and a control signal BSANk (e.g. at low potential) for activating the sense amplifier of the column Ck.

FIG. 10 shows an example of the structure of the sense amplifier controller 28-k shown in FIG. 9.

A write signal WE and an output signal CSLN from the column decoder are input to a NAND circuit 30-1. The write signal WE and an output signal from the NAND circuit 30-1 are input to a NAND circuit 30-2. The control signal SEN and an output signal from the NAND circuit 30-2 are input to a NAND circuit 30-3.

An inverted signal of the control signal SEN, i.e., an output signal from an inverter 32-1, and an inverted signal of an output signal from the NAND circuit 30-3, i.e., an output signal from an inverter 32-2 are input to a flip-flop circuit comprising two NOR circuits 31-1 and 31-2. An output signal SENn of the flip-flop circuit is input to the sense amplifier driver.

As shown in the following tables, in the sense amplifier controller, at a data write operation (WE="1"), the output signal SENn changes to "1" if the column select signal CSLN changes to "1" and then the control signal SEN becomes "1". On the other hand, at a data read operation (WE="0"), the value of the output signal SENn is controlled only by the value of control signal SEN. The reason is that the sense amplifier needs to be activated before the column select signal CSLN is selected, in order to prevent data destruction on the bitline at the data read operation.

| Write Mode | | | | | |
|---|---|---|---|---|---|
| CSLN | 0 | 0 | 0 | 1 | 1 |
| WE | 1 | 1 | 1 | 1 | 1 |
| SEN | 0 | 1 | 1 | 1 | 1 |
| /SENn | * | 0 | 1 | 0 | 1 |
| SENn | 0 | 0 | 1 | 1 | 1 |

| Read Mode | | | | | |
|---|---|---|---|---|---|
| CSLN | 0 | 0 | 0 | 1 | 1 |
| WE | 0 | 0 | 0 | 0 | 0 |
| SEN | 0 | 1 | 1 | 1 | 1 |
| /SENn | * | 1 | 0 | 1 | 0 |
| SENn | 0 | 1 | 1 | 1 | 1 |

FIG. 11 shows an example of the structure of the a sense amplifier and column select gate shown in FIG. 7.

The sense amplifier 15-k is a latch-type sense amplifier provided for each column of the memory cell array.

P-channel MOS transistors P1 and P2 are connected between a bitline BLj and a bitline BBLj of the bitline pair 22. The gate of MOS transistor P1 is connected to the bitline BBLj, and the gate of MOS transistor P2 to the bitline BLj. A control signal SAPk is applied to a node between MOS transistors P1 and P2.

When the potential of control signal SAPk rises to high level, the potential of one of bitlines of the bitline pair 22, which has a higher potential, is amplified.

N-channel MOS transistors N1 and N2 are connected between the bitline BLj and bitline BBLj of the bitline pair 22. The gate of MOS transistor N1 is connected to the bitline BBLj, and the gate of MOS transistor N2 to the bitline BLj. A control signal BSANk is applied to a node between MOS transistors N1 and N2.

When the potential of control signal BSANk falls to low level, the potential of one of bitlines of the bitline pair 22, which has a lower potential, is amplified.

The column select gate 19-k comprises N-channel MOS transistors N3 and N4 connected between the DQ line pair and bitline pair 22. A column select signal CSLk is applied to the gates of MOS transistors N3 and N4.

FIG. 12 is a timing chart illustrating the first timing of data write in the semiconductor memory device of the present invention.

First, the row address signal is delivered to the row decoder. The row decoder applies a high potential to the word line (row) WLi designated by the row address signal, thereby activating the word line WLi. In each of the blocks BK1, BK2, . . . , BKn, the data of memory cells connected to the activated word line WLi are led to the sense amplifiers corresponding to the columns C0 to C3.

At this time point, the control signal SEN output from the word line control circuit is at high potential (active).

Then, the column select signal CSL0 of column C0 designated by the column address signal is set at high potential (active level).

If the column select signal CSL0 rises to the high potential, the column select gate of column C0 is turned on and write data is led to the sense amplifier corresponding to the column C0. Since the sense amplifier corresponding to the column C0 is not activated at this time, the potential of the bitline pair BL0, BBL0 is inverted in a short time even if the write data differs from the data of the memory cell.

If the column select signal CSL0 rises to the high potential, the output signal SEN0 of the sense amplifier controller is set at high potential (active level) and the sense amplifier control circuit outputs a control signal SAP0 (high potential) and a BSAN0 (low potential) for activating the sense amplifier corresponding to the column C0.

As a result, the sense amplifier corresponding to the column C0 is activated and the potential of bitline pair BL0, BBL0 for column C0 is amplified. Thus, the data write in the memory cell of column C0 is completed.

At this time, the column select signals CSL1 to CSL3 are at low potential (inactive level) and the output signals SEN1 to SEN3 of the sense amplifier controllers do not rise to the high potential (active level). Thus the sense amplifiers corresponding to the columns C1 to C3 are not activated.

Accordingly, the potential of the bitline pairs for columns C1 to C3 is not amplified.

Subsequently, the column select signal CSL1 of column C1 designated by the column address signal is set at high potential (active level).

If the column select signal CSL1 rises to the high potential, the column select gate of column C1 is turned on and write data is led to the sense amplifier corresponding to the column C1. Since the sense amplifier corresponding to the column C1 is not activated at this time, the potential of the bitline pair BL0, BBL0 is inverted in a short time even if the write data differs from the data of the memory cell.

If the column select signal CSL1 rises to the high potential, the output signal SEN1 of the sense amplifier controller is set at high potential (active level) and the sense amplifier control circuit outputs a control signal SAP1 (high potential) and a BSAN1 (low potential) for activating the sense amplifier corresponding to the column C1.

As a result, the sense amplifier corresponding to the column C1 is activated and the potential of bitline pair BL1, BBL1 for column C1 is amplified. Thus, the data write in the memory cell of column C1 is completed.

At this time, the column select signals CSL2 and CSL3 are at low potential (inactive level) and the output signals SEN2 and SEN3 of the sense amplifier controllers do not rise to the high potential (active level). Thus the sense amplifiers corresponding to the columns C2 and C3 are not activated.

Accordingly, the potential of the bitline pairs for columns C2 and C3 is not amplified.

With this timing, data write in the memory cells of all columns C0 to C3 is carried out. Thereby, high-speed data write is achieved.

The above-described data write method is characterized in that when the column select signal CSLk for selecting the column Ck has risen to the high potential (active level), the sense amplifier control circuit activates only the sense amplifier corresponding to the column Ck and maintains the sense amplifiers of the other columns in the inactive state.

In other words, according to the method of the present invention, after all write data is led to the sense amplifiers, the sense amplifiers can be activated individually. Therefore, high-speed data write can be achieved.

FIG. 13 is a timing chart illustrating the second timing of data write in the semiconductor memory device according to the present invention.

According to the timing illustrated in FIG. 12, the sense amplifiers are activated so that the low-potential side and high-potential side of the bitline pair are amplified at the same time. According to the second timing, after the low-potential-side bitlines of the bitline pairs are individually amplified for the respective columns, the high-potential-side bitlines of the bitline pairs are amplified simultaneously for all columns.

First, the row address signal is delivered to the row decoder. The row decoder applies a high potential to the word line (row) WLi designated by the row address signal, thereby activating the word line WLi. In each block, BK1, BK2, . . . , BKn, the data of memory cells connected to the activated word line WLi are led to the sense amplifiers corresponding to the columns C0 to C3.

At this time point, the control signal SEN output from the word line control circuit is at high potential (active).

Then, the column select signal CSL0 of column C0 designated by the column address signal is set at high potential (active level).

If the column select signal CSL0 rises to the high potential, the column select gate of column C0 is turned on and write data is led to the sense amplifier corresponding to the column C0. Since the sense amplifier corresponding to the column C0 is not activated at this time, the potential of the bitline pair BL0, BBL0 is inverted in a short time even if the write data differs from the data of the memory cell.

If the column select signal CSL0 rises to the high potential, the output signal SEN0 of the sense amplifier controller is set at high potential (active level) and the sense amplifier control circuit outputs a BSAN0 (low potential) for activating part of the sense amplifier corresponding to the column C0.

As a result, a part of the sense amplifier corresponding to the column C0 is activated and the potential of the low-potential-side bitline of the bitline pair BL0, BBL0 of column C0 is amplified.

At this time, the column select signals CSL1 to CSL3 are at low potential (inactive level) and the output signals SEN1 to SEN3 of the sense amplifier controllers do not rise to the high potential (active level). Thus the sense amplifiers corresponding to the columns C1 to C3 are not activated.

Accordingly, the potential of the bitline pairs for columns C1 to C3 is not amplified.

Subsequently, the column select signal CSL1 of the column C1 designated by the column address signal is set at high potential (active level).

If the column select signal CSL1 rises to the high potential, the column select gate of column C1 is turned on and write data is led to the sense amplifier corresponding to the column C1. Since the sense amplifier corresponding to the column C1 is not activated at this time, the potential of the bitline pair BL0, BBL0 is inverted in a short time even if the write data differs from the data of the memory cell.

If the column select signal CSL1 rises to the high potential, the output signal SEN1 of the sense amplifier controller is set at high potential (active level) and the sense amplifier control circuit outputs a BSAN1 (low potential) for activating part of the sense amplifier corresponding to the column C1.

As a result, the part of the sense amplifier corresponding to the column C1 is activated and the potential of the low-potential-side bitline of the bitline pair BL1, BBL1 of column C1 is amplified.

At this time, the column select signals CSL2 and CSL3 are at low potential (inactive level) and the output signals SEN2 and SEN3 of the sense amplifier controllers do not rise to the high potential (active level). Thus the sense amplifiers corresponding to the columns C2 and C3 are not activated.

Accordingly, the potential of the bitline pairs for columns C2 and C3 is not amplified.

With this timing, data write for all columns C0 to C3 is transferred to the sense amplifiers.

When the sense amplifier control circuit outputs a control signal BSAN3 (low potential) to the last column C3, it simultaneously outputs control signals SAP0, SAP1, SAP2 and SAP3 (=SAP (high potential)).

As a result, all sense amplifiers corresponding to the columns C0 to C3 are activated and the potential of the high-potential-side bitlines of bitline pairs BL1, BBL1 of columns C0 to C3 is amplified.

Thereby, data can be written at high speed in a plurality of memory cells connected to the same row.

It should be noted that the control signals SAP0, SAP1, SAP2 and SAP3 (=SAP (high potential)) may be output after the control signal BSAN3 (low potential) has been output.

According to the above data write method, the potential of high-potential-side bitlines of bitline pairs BL1, BBL1 is amplified simultaneously for all columns. Thus, the control signals SAP0, SAP1, SAP2 and SAP3 may be generally treated as a control signal SAP. In other words, the control signal SAP for amplifying the potential of high-potential-side bitlines of bitline pairs BL1, BBL1 can be supplied commonly to the sense amplifiers of all columns and it suffices to use only one control signal line.

Therefore, the number of control signal lines can be reduced to one, and the size of memory chips can be reduced.

Furthermore, if the potential of one bitline of the bitline pair BL1, BBL1 is amplified, it is possible to prevent inversion of potential of the bitline pair due to leak or noise before the data write has been completely transferred to all columns.

FIG. 14 is a timing chart illustrating the third timing of data write in the semiconductor memory device according to the invention.

According to the timing illustrated in FIG. 12, the sense amplifiers are activated so that the low-potential side and high-potential side of the bitline pair are amplified at the same time. According to the third timing, after the high-potential-side bitlines of the bitline pairs are individually amplified for the respective columns, the low-potential-side bitlines of the bitline pairs are amplified simultaneously for all columns.

First, the row address signal is delivered to the row decoder. The row decoder applies a high potential to the word line (row) WLi designated by the row address signal, thereby activating the word line WLi. In each of the blocks BK1, BK2, . . . , BKn, the data of memory cells connected to the activated word line WLi are led to the sense amplifiers corresponding to the columns C0 to C3.

At this time point, the control signal SEN output from the word line control circuit is at high potential (active).

Then, the column select signal CSL0 of column C0 designated by the column address signal is set at high potential (active level).

If the column select signal CSL0 rises to the high potential, the column select gate of column C0 is turned on and write data is led to the sense amplifier corresponding to the column C0. Since the sense amplifier corresponding to the column C0 is not activated at this time, the potential of the bitline pair BL0, BBL0 is inverted in a short time even if the write data differs from the data of the memory cell.

If the column select signal CSL0 rises to the high potential, the output signal SEN0 of the sense amplifier controller is set at high potential (active level) and the sense amplifier control circuit outputs a SAP0(high potential) for activating part of the sense amplifier corresponding to the column C0.

As a result, the part of the sense amplifier corresponding to the column C0 is activated and the potential of the high-potential-side bitline of the bitline pair BL0, BBL0 for the column C0 is amplified.

At this time, the column select signals CSL1 to CSL3 are at low potential (inactive level) and the output signals SEN1 to SEN3 of the sense amplifier controllers do not rise to the high potential (active level). Thus the sense amplifiers corresponding to the columns C1 to C3 are not activated.

Accordingly, the potential of the bitline pairs for columns C1 to C3 is not amplified.

Subsequently, the column select signal CSL1 of column C1 designated by the column address signal is set at high potential (active level).

If the column select signal CSL1 rises to the high potential, the column select gate of column C1 is turned on and write data is led to the sense amplifier corresponding to the column C1. Since the sense amplifier corresponding to the column C1 is not activated at this time, the potential of the bitline pair BL0, BBL0 is inverted in a short time even if the write data differs from the data of the memory cell.

If the column select signal CSL1 rises to the high potential, the output signal SEN1 of the sense amplifier controller is set at high potential (active level) and the sense amplifier control circuit outputs a SAP1 (high potential) for activating part of the sense amplifier corresponding to the column C1.

As a result, a part of the sense amplifier corresponding to the column C1 is activated and the potential of the high-potential-side bitline of the bitline pair BL1, BBL1 of column C1 is amplified.

At this time, the column select signals CSL2 and CSL3 are at low potential (inactive level) and the output signals SEN2 and SEN3 of the sense amplifier controllers do not rise to the high potential (active level). Thus the sense amplifiers corresponding to the columns C2 and C3 are not activated.

Accordingly, the potential of the bitline pairs for columns C2 and C3 is not amplified.

With this timing, data write for all columns C0 to C3 is transferred to the sense amplifiers.

When the sense amplifier control circuit outputs a control signal SAP3 (high potential) to the last column C3, it simultaneously outputs control signals BSAN0, BSAN1, BSAN2 and BSAN3 (=BSAN (low potential)).

As a result, all sense amplifiers corresponding to the columns C0 to C3 are activated and the potential of the low-potential-side bitlines of bitline pairs BL1, BBL1 for columns C0 to C3 is amplified.

Thereby, data can be written at high speed in a plurality of memory cells connected to the same row.

It should be noted that the control signals BSAN0, BSAN1, BSAN2 and BSAN3 (=BSAN (low potential)) may be output after the control signal SAP3 (high potential) is output.

According to the above data write method, the potential of low-potential-side bitlines of bitline pairs BL1, BBLi is amplified simultaneously for all columns. Thus, the control signals BSAN0, BSAN1, BSAN2 and BSAN3 may be generally treated as a control signal BSAN. In other words, the control signal BSAN for amplifying the potential of low-potential-side bitlines of bitline pairs BL1, BBL1 can be supplied commonly to the sense amplifiers of all columns and it suffices to use only one control signal line.

Therefore, the number of control signal lines can be reduced to one, and the size of memory chips can be reduced.

Furthermore, if the potential of one bitline of the bitline pair BL1, BBL1 is amplified, it is possible to prevent inversion of potential of the bitline pair due to leak or noise before the data write has been completely transferred to all columns.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

I claim:

1. A semiconductor memory device comprising:

a memory cell array including a plurality of memory cells arranged in an array and having a plurality of rows and a plurality of columns;

a plurality of column select gates, provided in association with said plurality of columns, for selecting at least one column of said plurality of columns of said memory cell array;

a column decoder for outputting a column select signal to said plurality of column select gates;

a plurality of sense amplifiers arranged between said memory cell array and said plurality of column select gates and provided in association with said plurality of columns; and a sense amplifier control circuit for controlling activation of said sense amplifiers independently such that the sense amplifier control circuit activates at least one selected sense amplifier of said plurality of sense amplifiers, which is associated with said at least one column of said plurality of columns selected by said plurality of column select gates, and maintains the unselected sense amplifiers associated with those columns, which are not selected by said plurality of column select gates, in an inactive state.

2. The semiconductor memory device according to claim 1, wherein said sense amplifier control circuit activates the selected sense amplifier at the same time as or after the selection of the column to be selected.

3. The semiconductor memory device according to claim 1, further comprising a row decoder for selecting at least one of said plurality of rows of the memory cell array, wherein said sense amplifier control circuit activates the selected sense amplifier while the row of the memory cell array is selected by said row decoder.

4. The semiconductor memory device according to claim 1, wherein each of said plurality of sense amplifiers includes a first portion for amplifying a potential of a low-potential-side bitline of a bitline pair of the memory cell array, and a second portion for amplifying a potential of a high-potential-side bitline of the bitline pair of the memory cell array, and said sense amplifier control circuit simultaneously activates said first portion and said second portion of the selected sense amplifier.

5. The semiconductor memory device according to claim 1, wherein each of said plurality of sense amplifiers includes a first portion for amplifying a potential of a low-potential-side bitline of a bitline pair of the memory cell array, and a second portion for amplifying a potential of a high-potential-side bitline of the bitline pair of the memory cell array, and said sense amplifier control circuit activates said first portions of said plurality of sense amplifiers at different time points and activates said second portions of said plurality of sense amplifiers at the same time as or after the completion of activation of the first portions of all the sense amplifiers.

6. The semiconductor memory device according to claim 1, wherein each of said sense amplifiers includes a first portion for amplifying a potential of a low-potential-side bitline of a bitline pair of the memory cell array, and a second portion for amplifying a potential of a high-potential-side bitline of the bitline pair of the memory cell array, and said sense amplifier control circuit activates said second portions of said plurality of sense amplifiers at different time points and activates said first portions of said plurality of sense amplifiers at the same time as or after the completion of activation of the second portions of all said plurality of sense amplifiers.

7. The semiconductor memory device according to claim 1, wherein said memory cell array comprises at least two blocks, and said selected sense amplifier is activated for each of said at least two blocks.

8. The semiconductor memory device according to claim 1, wherein said sense amplifier control circuit controls activation of the sense amplifiers independently only when data is to be written.

9. The semiconductor memory device according to claim 1, wherein said sense amplifier control circuit is configured to control activation of said sense amplifiers independently at least during a writing operation.

10. A data write method comprising:

a first step of selecting a row of a memory cell array;

a second step of selecting a column of the memory cell array by means of a column select signal, and activating a sense amplifier of the selected column selected on the basis of the column select signal independently from sense amplifiers of non-selected columns, at the same time as or after write data is delivered to the selected column; and a third step of performing the second step again, and selecting all columns of the memory cell array and writing data in the memory cells belonging to the same row of the memory cell array.

11. The data write method according to claim 10, wherein in said second step the sense amplifier of the selected column simultaneously amplifies a potential of a low-potential-side bitline and a high-potential-side bitline of a bitline pair of the selected column.

12. The data write method according to claim 10, wherein in the second step the sense amplifier of the selected column amplifies a potential of a low-potential-side bitline of a bitline pair of the selected column, and a high-potential-side bit line of the bitline pair of the selected column is amplified at the same time as or after a potential of a low-potential-side bitline of a bitline pair of a finally selected column is amplified.

13. The data write method according to claim 10, wherein in the second step the sense amplifier of the selected column amplifies a potential of a high-potential-side bitline of a bitline pair of the selected column, and a low-potential-side bit line of the bitline pair of the selected column is amplified at the same time as or after a potential of a high-potential-side bitline of a bitline pair of a finally selected column is amplified.

14. A semiconductor memory device comprising:

a memory cell array arranged in blocks of memory cells;

bit lines connected to said memory cells;

sense amplifiers associated with said blocks, said sense amplifiers connected to said bit lines for sensing a charge in said memory cells;

a sense amplifier control circuit for controlling said sense amplifiers so as to activate at least one sense amplifier per block of memory cells and maintaining at least one of the other sense amplifiers in said block in an inactive state.

15. The semiconductor memory device according to claim 14, wherein each block includes at least two sense amplifiers.

16. The semiconductor memory device according to claim 14, wherein said sense amplifier control circuit simultaneously actives at least one sense amplifier in separate blocks.

17. The semiconductor memory device according to claim 14, wherein said sense amplifiers are configured to amplify a difference in a potential between said bit lines, and said sense amplifier control circuit is configured to control said sense amplifiers so as to activate at least said one sense amplifier per block of memory cells during a writing operation and maintaining at least said one of the other sense amplifiers in said block in an inactive state during said writing operation.

18. A method of controlling sense amplifiers associated with blocks of memory cells including the steps of:

a) selecting a row of a memory cells in a block of said blocks;

b) selecting a column of memory cells in said block;

c) activating a sense amplifier associated with said selected column;

d) maintaining said sense amplifier in an activated state;

e) repeating steps b through d on subsequent columns and sense amplifiers associated with said row until said row of memory cells has been written.

* * * * *